(12) United States Patent
Su et al.

(10) Patent No.: US 12,361,994 B2
(45) Date of Patent: Jul. 15, 2025

(54) SEMICONDUCTOR MEMORY STRUCTURE AND METHOD FOR FORMING THE SEMICONDUCTOR MEMORY STRUCTURE

(71) Applicant: Taiwan Semiconductor Manufacturing Company, Ltd., Hsinchu (TW)

(72) Inventors: Chih-Chuan Su, Hsinchu (TW); Yu-Jen Wang, Hsinchu (TW); Liang-Wei Wang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 608 days.

(21) Appl. No.: 17/571,945

(22) Filed: Jan. 10, 2022

(65) Prior Publication Data

US 2023/0223063 A1 Jul. 13, 2023

(51) Int. Cl.
*G11C 11/16* (2006.01)
*H10B 61/00* (2023.01)
*H10N 50/01* (2023.01)
*H10N 50/10* (2023.01)
*H10N 50/80* (2023.01)
*H10N 50/85* (2023.01)

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
None
See application file for complete search history.

(56) References Cited

U.S. PATENT DOCUMENTS

2017/0092845 A1* 3/2017 Chuang ................. H10N 50/80
2019/0259808 A1* 8/2019 Jacob ..................... H10N 50/80

* cited by examiner

*Primary Examiner* — Stephanie P Duclair
(74) *Attorney, Agent, or Firm* — McClure, Qualey & Rodack, LLP

(57) ABSTRACT

A semiconductor memory structure includes bottom electrodes formed over a substrate. The structure also includes first magnetic tunneling junction (MTJ) elements formed over the bottom electrodes in a first region and a second region of the substrate. The structure also includes second MTJ elements formed over the first MTJ elements in the first region and the second region. The structure also includes top electrodes formed over the second MTJ elements. The first MTJ elements in the first region are narrower than the second MTJ elements in the first region, and the second MTJ elements in the second region are narrower than the first MTJ elements in the second region.

20 Claims, 14 Drawing Sheets

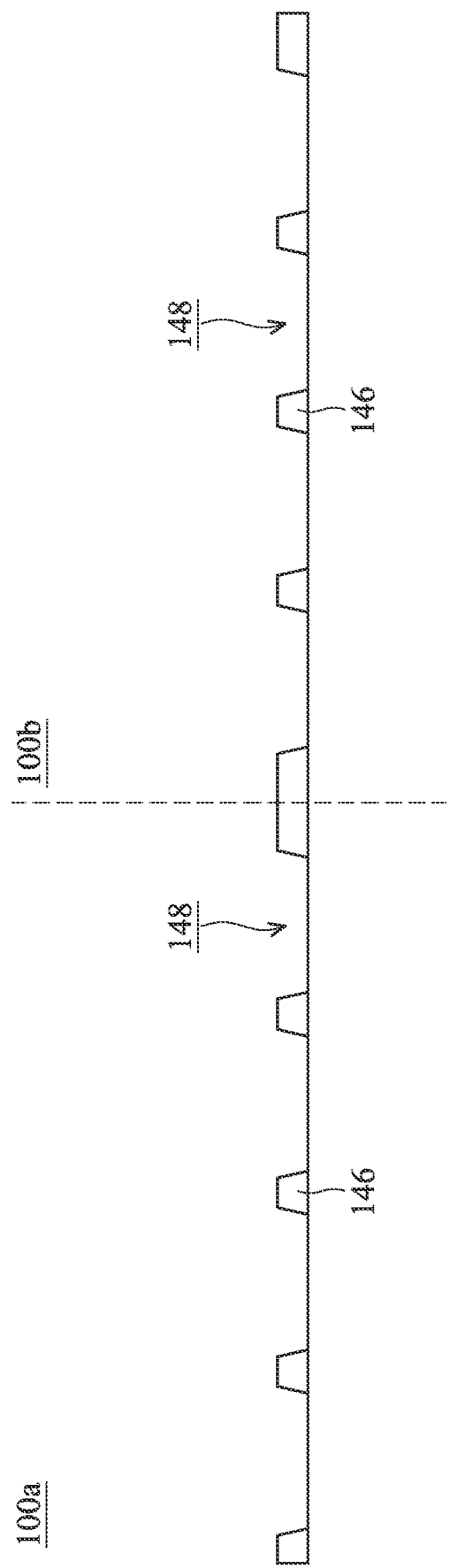

SEMICONDUCTOR MEMORY STRUCTURE AND METHOD FOR FORMING THE SEMICONDUCTOR MEMORY STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A-4J are cross-sectional representations of various stages of forming a semiconductor memory structure, in accordance with some embodiments of the disclosure.

DETAILED DESCRIPTION

Figure 1:
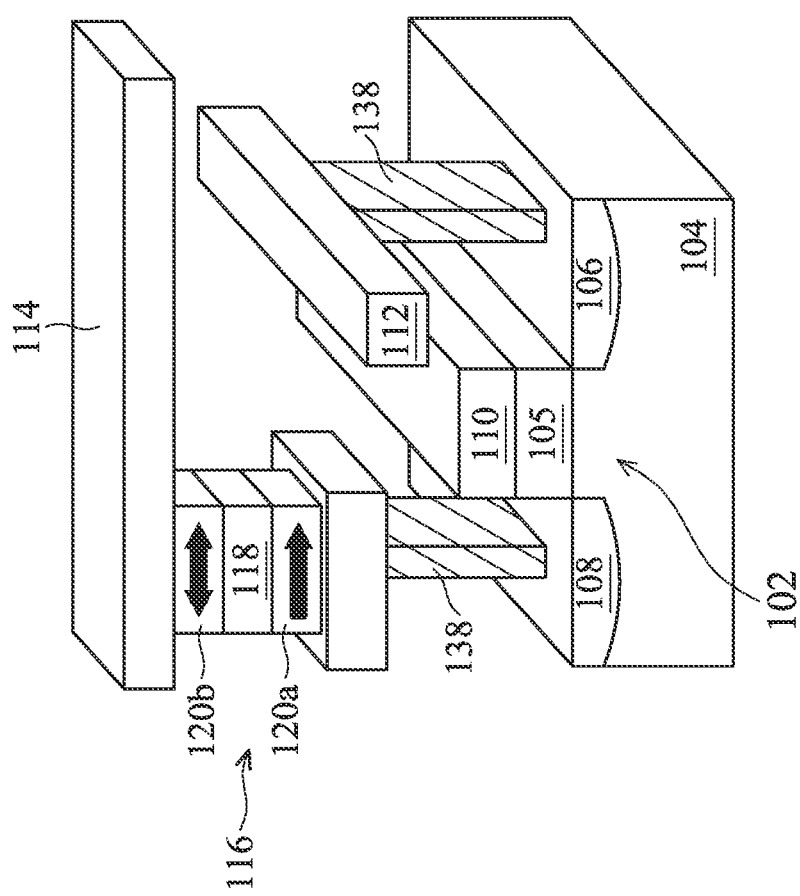
FIG. 1 is a perspective representation of a semiconductor memory structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor memory structure are provided. The method for forming the semiconductor memory structure may include forming magnetic tunneling junction (MTJ) stacks of a magnetoresistive random-access memory (MRAM) cell in different regions of the substrate. Each MTJ stack includes different elements arranged in different sequences. Each MTJ stack may provide different functions. The MTJ stack with the smallest size may dominate the resistance. By modifying the size of each MTJ stack, the MRAM cells may provide different functions, and the semiconductor memory structure may provide multiple applications in a single chip.

FIG. 1 is a perspective representation of a semiconductor memory structure 10a, in accordance with some embodiments of the disclosure. A device 102 may be formed over a substrate 104. The device 102 including a gate structure 105, a source region 106, and a drain region 108. The gate structure 105 may be electrically coupled to a word line (WL) 110. The source region 106 may be electrically coupled to a source line (SL) 112, and the drain region 108 may be electrically coupled to bit line (BL) 114. A magnetic tunneling junction (MTJ) stack 116 may be formed between the drain region 108 and the BL 114. The MTJ stack 116 may include an insulating layer 118 sandwiched between a bottom ferromagnetic plate 120a and an upper ferromagnetic plate 120b. The bottom ferromagnetic plate 120a may be a pinned antiferromagnetic layer, and the upper ferromagnetic plate 120b may be a free magnetic layer with more than two magnetic field values. Therefore, two or more data states may be stored in the MTJ stack 116.

The MTJ stack 116 may use tunnel magnetoresistance (TMR) to store the magnetic fields on the upper ferromagnetic plates 120b and the lower ferromagnetic plates 120a. Electrons may tunnel from the upper ferromagnetic plates 120b to the lower ferromagnetic plates 120a. The current may induce a magnetic field in the upper ferromagnetic plates 120b. The MTJ stack 116 may also use spin-transfer-torque (STT) to store magnetic fields on the upper ferromagnetic plates 120b and the lower ferromagnetic plates 120a. A spin-aligned or polarized electron flow is used to change the magnetic field within the upper ferromagnetic plates 120b. Data writing method involves in changing the magnetic field within the upper ferromagnetic plates 120b.

The electrical resistance of the MTJ stack 116 changes as the magnetic fields stored in the upper and lower ferromagnetic plates 120b and 120a changes, due to the magnetic tunnel effect. For example, when the magnetic fields of the upper and lower ferromagnetic plates 120b and 120a are aligned in the same direction, the MTJ stack 116 is in a low-resistance state. When the magnetic fields of the upper and lower ferromagnetic plates 120b and 120a are in opposite directions, the MTJ stack 116 is in a high-resistance state. The direction of the magnetic field of the upper ferromagnetic plate 120b can be changed by passing a current through the MTJ stack 116. By measuring the electrical resistance between the upper and lower ferromagnetic plates 120b and 120a, a read circuitry coupled to the MTJ stack 116 can discern between the low-resistance state and the high-resistance state.

Figure 2:
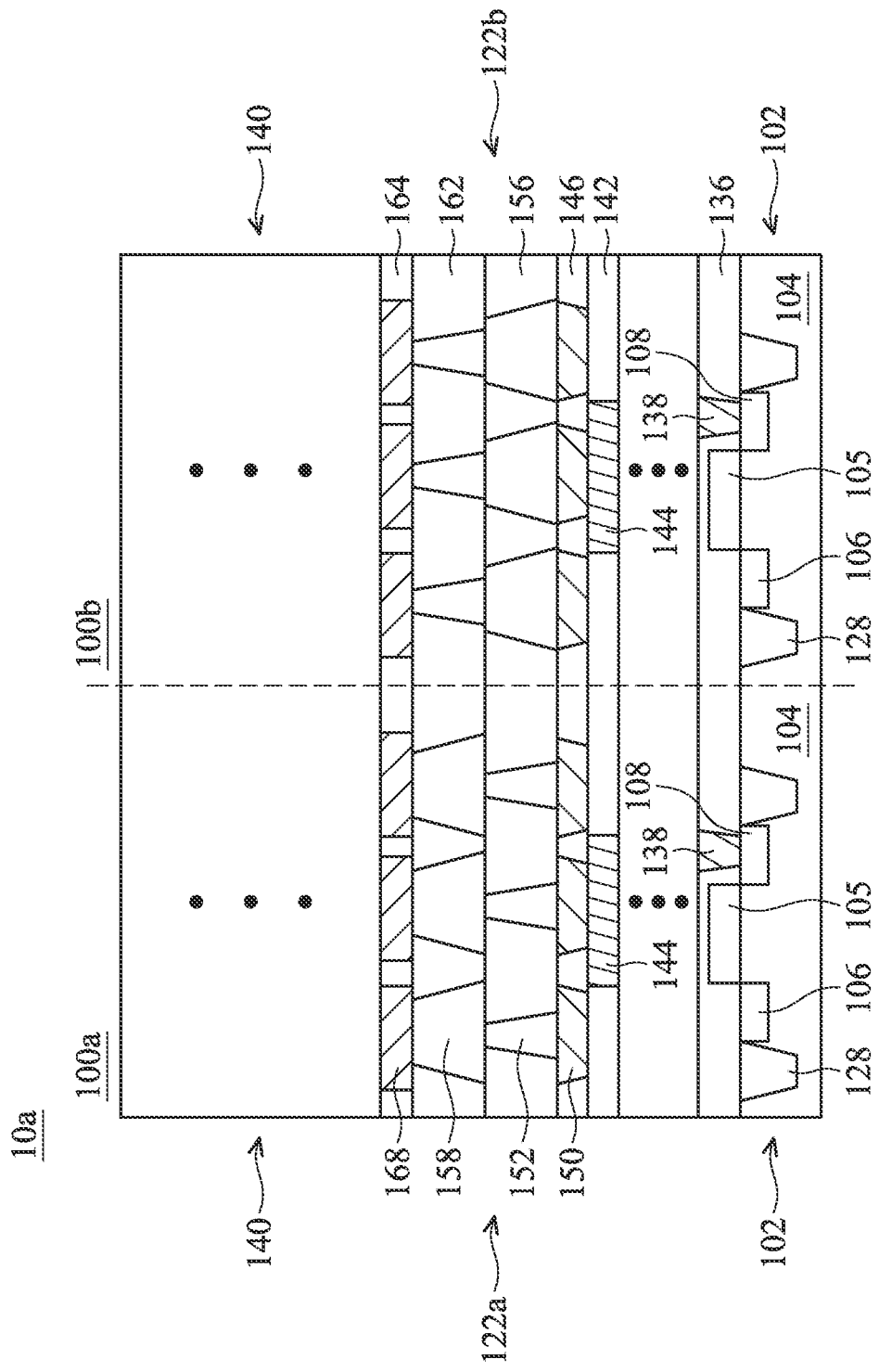
FIG. 2 is a cross-sectional representation of a semiconductor memory structure, in accordance with some embodiments of the disclosure.

FIG. 2 is a cross-sectional representation of a semiconductor memory structure 10a, in accordance with some embodiments of the disclosure. In some embodiments, the semiconductor memory structure 10a includes a first region 100a and a second region 100b in the substrate 104. In the first region 100a and the second region 100b, different MRAM cells 122a and 122b may be provided. For example, the first MRAM cell 122a may be formed in the first region 100a, and the second MRAM cell 122b may be formed in the second region 100b. The first MRAM cell 122a and the second MRAM cell 122b may have different functions, such as flash memory-like function, SRAM-like function, or DRAM-like function. In some embodiments, the semiconductor memory structure 10a includes MRAM cells 122a and 122b with multi-functions. In some embodiments as shown in FIG. 2, the same transistor 102 is formed over the substrate 104 in the first region 100a and the second region 100b, and the MRAM cells 122a and 122b are formed over the transistor 102 in the first region 100a and the second region 100b, respectively.

Figure 3:
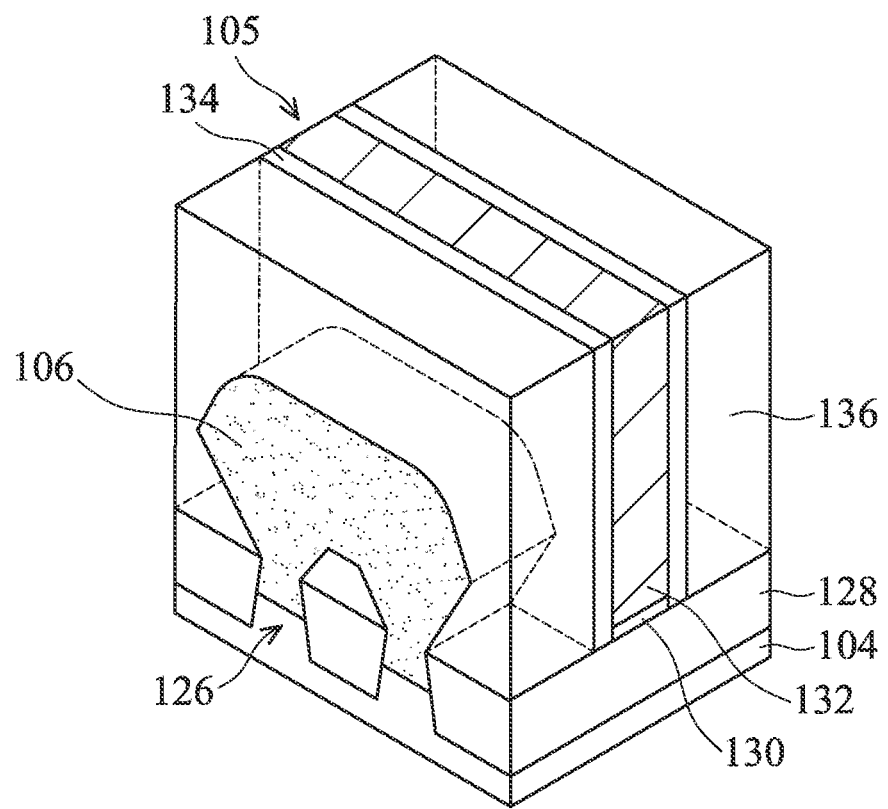
FIG. 3 is a perspective representation of a semiconductor memory structure, in accordance with some embodiments of the disclosure.

The transistor 102 may be a FinFET device, as shown in FIG. 3 in accordance with some embodiments. The transistor 102 may also be planar transistors, gate-all-around (GAA) transistors, or other non-planar transistors.

A substrate 104 is provided as shown in FIGS. 1-3 in accordance with some embodiments. The substrate 104 may be a semiconductor wafer such as a silicon wafer. The substrate 104 may also include other elementary semiconductor materials, compound semiconductor materials, and/or alloy semiconductor materials. Examples of elementary semiconductor materials may include, but are not limited to, crystal silicon, polycrystalline silicon, amorphous silicon, germanium, and diamonds. Examples of compound semiconductor materials include, but are not limited to, silicon carbide, gallium nitride, gallium arsenic, gallium phosphide, indium phosphide, indium arsenide, and indium antimonide. Examples of alloy semiconductor materials may include, but are not limited to, SiGe, GaAsP, AlInAs, AlGaAs, GaInAs, GaInP, and GaInAsP. The substrate 104 may include an epitaxial layer. For example, the substrate 104 may be an epitaxial layer overlying a bulk semiconductor. In addition, the substrate 104 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 104 may be an N-type substrate. The substrate 104 may be a P-type substrate.

Next, a pad layer may be blanketly formed over the substrate 104, and a hard mask layer may be blanketly formed over the pad layer (not shown). The pad layer may be a buffer layer between the substrate 104 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 104 to form a fin structure 126 by using the hard mask layer as a mask as shown in FIG. 3 in accordance with some embodiments. The etching process may be a dry etching process or a wet etching process. In some embodiments, the substrate 104 is etched by a dry etching process. The dry etching process may include using a fluorine-based etchant gas, such as $SF_6$, $C_xF_y$, (where x and y may be positive integers), $NF_3$, or a combination thereof. The etching process may be a time-controlled process, and continue until the fin structure 126 reaches a predetermined height. It should be noted that since the fin structure 126 and the substrate 104 are made of the same material, and there is no obvious interface between them.

Next, a liner layer may be conformally formed on the sidewalls and the top surface of the fin structure 126 (not shown). The liner layer may be used to protect the fin structure 126 from being damaged in the following processes (such as an anneal process or an etching process). The liner layer may be made of silicon nitride.

Next, an isolation layer 128 is formed to cover the fin structure 126 and the substrate 104 as shown in FIG. 3 in accordance with some embodiments. The isolation layer 128 may be made of silicon oxide, silicon nitride, silicon oxynitride, fluoride-doped silicate glass (FSG), or another low-k dielectric material. The isolation layer 128 may be deposited by a deposition process, such as a chemical vapor deposition (CVD) process, a spin-on-glass process, or another applicable process.

Afterwards, the isolation layer 128 may be planarized to expose the top surface of the patterned hard mask layer (not shown). The isolation layer 128 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 128, as shown in FIG. 3 in accordance with some embodiments. The etching process may be used to remove a portion of the liner layer and a portion of the isolation layer 128. As a result, the top portion of the fin structure 126 may be exposed and the remaining isolation layer 128 may surround the base portion of the fin structure 126. The remaining isolation layer 128 may be an isolation structure 128 such as a shallow trench isolation (STI) structure surrounding the base portion of the fin structure 126. The isolation structure 128 may be configured to prevent electrical interference or crosstalk.

Next, a dummy gate structure is formed over and across the fin structure 126 (not shown). The dummy gate structure may include a dummy gate dielectric layer and a dummy gate electrode layer. The dummy gate dielectric layer and the dummy gate electrode layer may be replaced by the following steps to form a real gate structure with a high-k dielectric layer and a metal gate electrode layer.

The dummy gate dielectric layer may include silicon oxide. The silicon oxide may be formed by an oxidation process (e.g., a dry oxidation process, or a wet oxidation process), a chemical vapor deposition process, other applicable processes, or a combination thereof. Alternatively, the dummy gate dielectric layer may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer may include polycrystalline-silicon (poly-Si), poly-crystalline silicon-germanium (poly-SiGe), other applicable materials, or a combination thereof. The dummy gate electrode layer may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the dummy gate dielectric layer and the dummy gate electrode layer to form the dummy gate structure by using a patterned photoresist layer as a mask (not shown). The etching process may be a dry etching process or a wet etching process. The dummy gate dielectric layer and a dummy gate electrode layer may be etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 126 may be exposed on opposite sides of the dummy gate structure.

Next, a pair of spacers 134 is formed on opposite sidewalls of the dummy gate structure, as shown in FIG. 3 in accordance with some embodiments. The spacers 134 may be made of silicon oxide, silicon nitride, silicon oxynitride, and/or dielectric materials. The spacers 134 may be formed by a chemical vapor deposition (CVD) process, a spin-on-glass process, or another applicable process.

Afterwards, the top portion of the fin structure 126 exposed on opposite sides of the dummy gate structure may be removed in an etching process to form a recess (not shown). The etching process may be a dry etching process or a wet etching process. The fin structures 126 may be etched by a dry etching process. The dry etching process may include using a fluorine-based etchant gas, such as $SF_6$, $C_xF_y$ (where x and y may be positive integers), $NF_3$, or a combination thereof.

Next, a source epitaxial structure 106 and a drain epitaxial structure 108 are formed in the recess over the fin structure 126 on opposite sides of the dummy gate structure, as shown in FIGS. 2 and 3 in accordance with some embodiments. A strained material may be grown in the recess by an epitaxial (epi) process to form the source epitaxial structure 106 and the drain epitaxial structure 108. In addition, the lattice constant of the strained material may be different from the lattice constant of the substrate 104. The source epitaxial structure 106 and the drain epitaxial structure 108 may include Ge, SiGe, InAs, InGaAs, InSb, GaAs, GaSb, InAlP, InP, SiC, SiP, other applicable materials, or a combination thereof. The source epitaxial structure 106 and the drain epitaxial structure 108 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the source epitaxial structure 106 and the drain epitaxial structure 108 are formed, a first inter-layer dielectric (ILD) structure 136 is formed to cover the source epitaxial structure 106 and the drain epitaxial structure 108, as shown in FIGS. 2 and 3 in accordance with some embodiments. The first ILD structure 136 may surround the fin structure 126, the source epitaxial structure 106, and the drain epitaxial structure 108.

The first ILD structure 136 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluoride-doped silicate glass (FSG), carbon doped silicon oxide, amorphous fluorinated carbon, parylene, bis-benzocyclobutenes (BCB), and polyimide. The first ILD structure 136 may be formed by chemical vapor deposition (CVD), spin-on coating, or other applicable processes.

Afterwards, a planarizing process is performed on the first ILD structure 136 until the top surface of the dummy gate structure is exposed, as shown in FIG. 3 in accordance with some embodiments. After the planarizing process, the top surface of the dummy gate structure may be substantially level with the top surfaces of the spacers 134 and the first ILD structure 136. The planarizing process may include a grinding process, a chemical mechanical polishing (CMP) process, an etching process, other applicable processes, or a combination thereof.

Next, the dummy gate structure including the dummy gate dielectric layer and the dummy gate electrode layer is removed to form a trench between the spacers 134 (not shown). The fin structure 126 may be exposed form the trench. The dummy gate dielectric layer and the dummy gate electrode layer may be removed by an etching process, such as a dry etching process or a wet etching process.

Next, an interfacial layer 130 is formed across the fin structure 126, as shown in FIG. 3 in accordance with some embodiments. The interfacial layer 130 may be made of silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. The interfacial layer 130 may be thermally grown using a thermal oxidation process in oxygen-containing ambient or nitrogen-containing ambient (e.g. NO or $N_2O$).

Next, a gate electrode layer 132 is formed over the interfacial layer 130, and a gate structure 105 is formed as shown in FIGS. 1-3 in accordance with some embodiments. The gate electrode layer 132 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 132 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof. Afterwards, a chemical mechanical polishing (CMP) process or an etching back process may be optionally performing to remove excess gate electrode layer materials.

Afterwards, a patterning and an etching process are performed to form an opening in the first ILD structure 136 by using a patterned photoresist layer as a mask (not shown). A portion of the source epitaxial structure 106 and the drain epitaxial structure 108 may be exposed from the opening. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process.

Next, a metal semiconductor compound layer may be formed over the source epitaxial structure 106 and the drain epitaxial structure 108 (now shown). The metal semiconductor compound layer may reduce the contact resistance between the source epitaxial structure 106, the drain epitaxial structure 108 and the subsequently formed contact structure over the source epitaxial structure 106 and the drain epitaxial structure 108. The metal semiconductor compound layer may be made of titanium silicide ($TiSi_2$), nickel silicide (NiSi), cobalt silicide (CoSi), or other suitable low-resistance materials. The metal semiconductor compound layer may be formed over the source epitaxial structure 106 and the drain epitaxial structure 108 by forming a metal layer over the source epitaxial structure 106 and the drain epitaxial structure 108 first. The metal layer may react with the source epitaxial structure 106 and the drain epitaxial structure 108 in an annealing process and a metal semiconductor compound layer may be produced. Afterwards, the unreacted metal layer may be removed in an etching process and the metal semiconductor compound layer may be left.

Afterwards, a contact structure 138 is formed into the opening over the source epitaxial structure 106 and the drain epitaxial structure 108, as shown in FIGS. 1 and 2 in accordance with some embodiments. The contact structure 138 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 138 may be formed using a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 138, and then a planarization process such as a chemical mechanical polishing (CMP) process or an etch back process is optionally performed to remove excess conductive materials. After the planarization process, the top surface of the contact structure 138 may be level with the top surface of the first ILD structure 136.

Next, an interconnect structure 140 is formed over the first ILD structure 136 and the contact structure 138, as shown in FIG. 2 in accordance with some embodiments. The interconnect structure 140 may include multiple metal layers formed in inter-metal dielectric (IMD) structures. An interconnect structure 140 including the MRAM cells 122a and 122b are formed over the device 102 in the first region 100a and the second region 100b, respectively, as shown in FIG. 2 in accordance with some embodiments. The MRAM cells 122a and 122b are a part of the interconnect structure 140.

An inter-metal dielectric (IMD) structure 142 is formed in the interconnect structure 140, as shown in FIG. 2 in accordance with some embodiments. The IMD structure 142 may include an oxide such as silicon dioxide, a low-k dielectric material such as carbon doped oxides, or an extreme low-k dielectric material such as porous carbon doped silicon dioxide. The IMD structure 142 may be deposited by a high aspect ratio process (HARP) and/or CVD process such as high density plasma (HDP) CVD atmospheric pressure CVD (APCVD), low-pressure CVD (LPCVD), or plasma-enhanced CVD (PECVD) process.

Next, the IMD structure 142 is patterned and etched, and a metal layer 144 is formed in the IMD structure 142. The metal layer 144 may include Cu, W, Ag, Ag, Sn, Ni, Co, Cr, Ti, Pb, Au, Bi, Sb, Zn, Zr, Mg, In, Te, Ga, other applicable metallic materials, an alloy thereof, or a combination thereof. The metal layer 144 may include a stacked structure of TiN/AlCu/TiN. The metal layer material 144 may be formed in the opening of the IMD structure, as shown in FIG. 2 in accordance with some embodiments. After the metal layer material 144 is deposited, a planarization process (e.g., a chemical mechanical polishing process or an etching back process) may optionally be performed to remove excess metal layer material 144.

Next, MRAM cells 122a and 122b are formed over the metal layer 144 in the first region 100a and the second region 100b, respectively, as shown in FIG. 2 in accordance with some embodiments.

A dielectric barrier layer may be deposited over the metal layer 144 and the IMD structure 142 (not shown). The dielectric barrier layer may include dielectric materials such as $Si_3N_4$, SiON, SiC, SiCN, other applicable dielectric materials, or a combination thereof. The dielectric barrier layer may be formed by PVD, CVD, ALD, other applicable processes, or a combination thereof.

Next, a dielectric layer may be formed over the dielectric barrier layer (not shown). The dielectric layer may include a metal-based dielectric material, such as aluminum oxide (i.e., $AlO_x$ such as $Al_2O_3$). The dielectric layer may be formed by CVD, ALD, other applicable processes, or a combination thereof.

Next, a bottom electrode via (BEVA) may be formed through the dielectric barrier layer and the dielectric layer (not shown). A barrier layer may be formed over the sidewalls and the bottom surface of the BEVA. The bottom electrode via and the barrier layer may shield external magnetic fields. The barrier layer may be in contact with the metal layer 144, and the BEVA is electrically connected to the device 102. The barrier layer is sandwiched between the BEVA and the metal layer 144, and is also between the BEVA and the dielectric layer surrounding the bottom electrode via. The BEVA may include tungsten, titanium, tantalum, tungsten nitride, titanium nitride, tantalum nitride, other suitable materials, or a combination thereof. The barrier layer may be formed of titanium nitride, tantalum nitride, other suitable materials, or a combination thereof.

Next, a dielectric layer 146 is formed over the barrier layer and the dielectric layer, as shown in FIGS. 2 and 4A in accordance with some embodiments. The dielectric layer 146 may include un-doped silicate glass (USG), doped silicon oxide such as borophosphosilicate glass (BPSG), fluoride-doped silicate glass (FSG), phosphosilicate glass (PSG), boron doped silicon glass (BSG), other suitable dielectric materials, or a combination thereof. The dielectric layer 146 may be formed by CVD, PVD, other applicable processes, or a combination thereof.

Afterwards, a patterning and an etching process are performed to form an opening 148 in the dielectric layer 146 by using a patterned photoresist layer as a mask, as shown in FIG. 4A in accordance with some embodiments. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. The metal layer 144 may be exposed from the opening 148 in the dielectric layer 146.

Figure 4B:
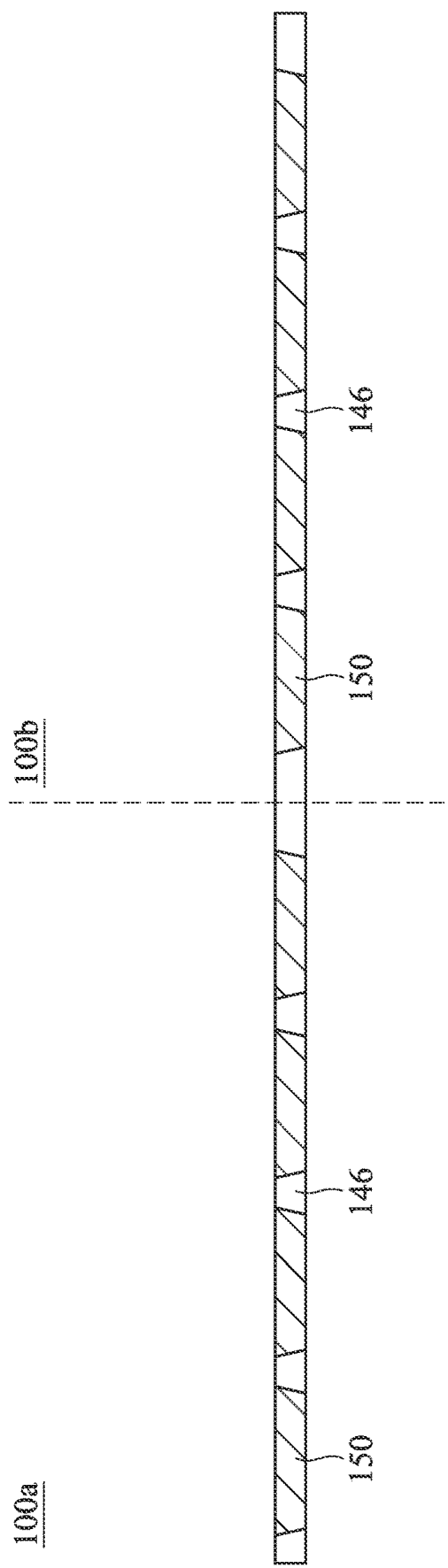

Next, a bottom electrode 150 is formed in the opening 148, as shown in FIGS. 2 and 4B in accordance with some embodiments. The bottom electrode material may be conformally deposited in the opening 148, and then the bottom electrode material is etched back to expose the bottom electrode via. In some embodiments, the bottom electrode 150 is electrically connected to the contact structure 138.

The bottom electrode 150 may include TiN, TaN, WN, Ru, Ti, Ta, W, Mo, Re, Nb, other applicable materials, an alloy thereof, or a combination thereof. The bottom electrode 150 may be formed by a chemical vapor deposition process (CVD), a physical vapor deposition process (PVD), (e.g., evaporation or sputter), an atomic layer deposition process (ALD), an electroplating process, another suitable process, or a combination thereof.

Figure 4C:
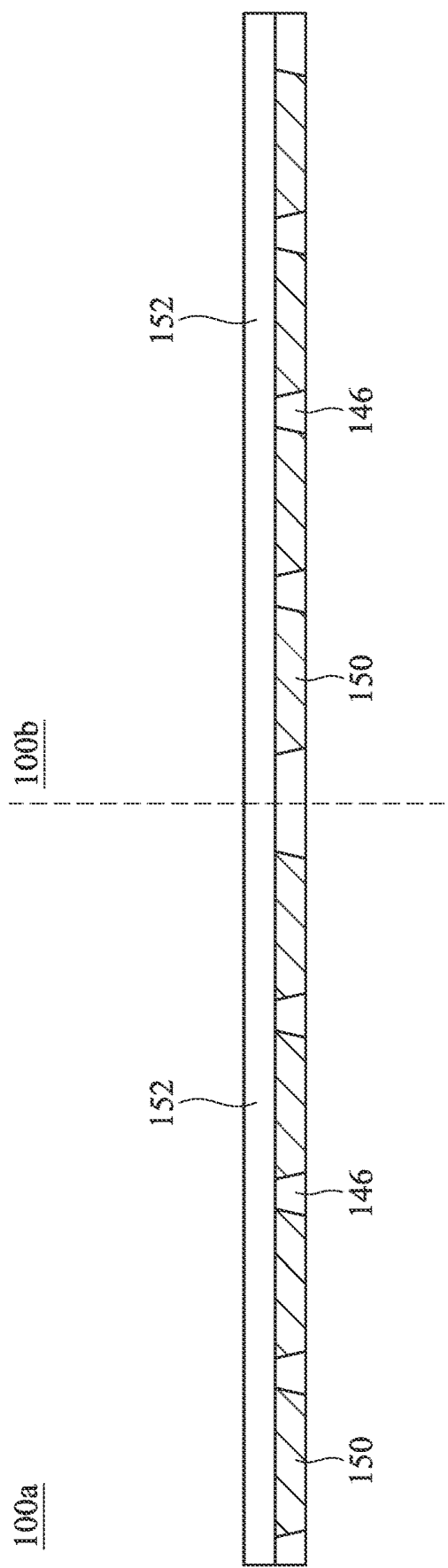
Figure 4D:
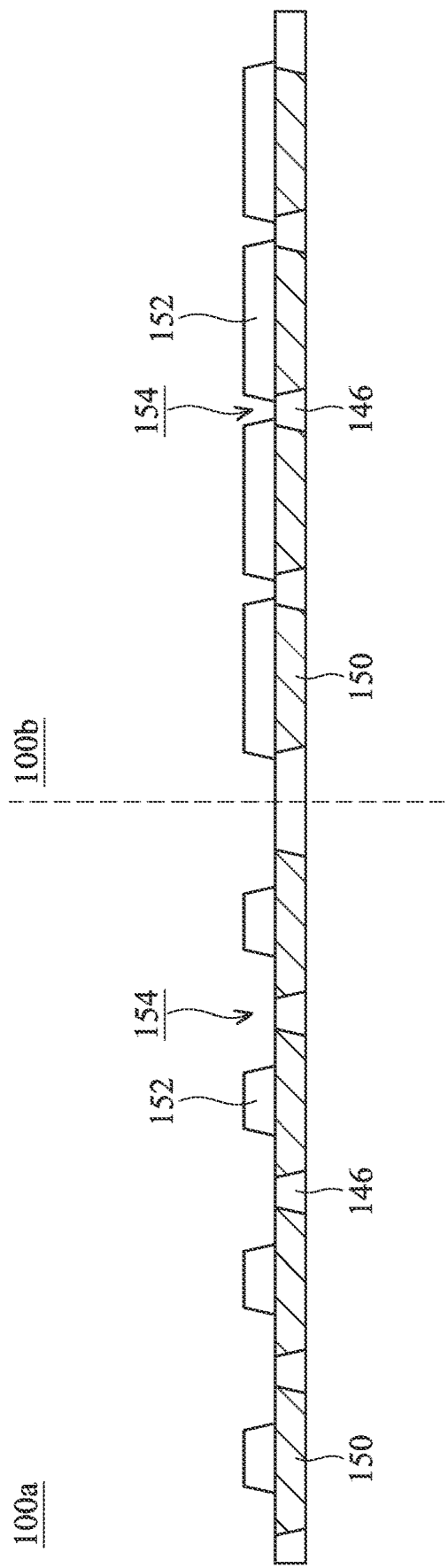

Next, a first MTJ stack material 152 is formed over the dielectric layer 146 and the bottom electrode 150, as shown in FIGS. 2 and 4C in accordance with some embodiments. The first MTJ stack material 152 may include a stack of ferromagnetic layers, MTJ spacers, and a capping layer. The ferromagnetic layer may function as a free layer whose magnetic polarity or magnetic orientation can be changed during write operation of the MRAM cell. The ferromagnetic layers and the MTJ spacer may function as a fixed or pinned layer whose magnetic orientation may not be changed during operation of the MRAM cell. The first MTJ stack material 152 may also include an antiferromagnetic layer. In some embodiments, the number of the ferromagnetic layers is between from about 10 to about 15.

The capping layer may be formed over the ferromagnetic layer. Each of the ferromagnetic layers may include ferromagnetic material, which may be metal or metal alloy. For example, the ferromagnetic layers may include Fe, Co, Ni, CoFeB, FeB, CoFe, FePt, FePd, CoPt, CoPd, CoNi, TbFeCo, CrNi, or the like. The MTJ spacer may include non-ferromagnetic metal such as Ag, Au, Cu, Ta, W, Mn, Pt, Pd, V, Cr, Nb, Mo, Tc, Ru or the like. The MTJ spacer may also include insulator such as $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell.

Next, the first MTJ stack material 152 is patterned and openings 154 is formed in the first MTJ stack material 152, and the first MTJ stack 152 is formed in the first region 100a and the second region 100b. In some embodiments, the first MTJ stack 152 has different patterns in the first region 100a and the second region 100b. In some embodiments, different patterns of the first MTJ stack 152 in the first region 100a and the second region 100b are formed by the same mask. In some embodiments, the area of the first MTJ stack 152 in the first region 100a and the area of the first MTJ stack 152 in the second region 100b are different. In some embodiments, the first MTJ stack 152 in the first region 100a is narrower than the first MTJ stack 152 in the second region 100b.

In some embodiments, by stacking ferromagnetic layer of the first MTJ stack material 152 with different composition with different sequence, the first MTJ stack 152 may provide different functions. For example, the MRAM cells 122a and 122b may be served as flash memory, SRAM, DRAM, or other applicable functions.

Figure 4E:
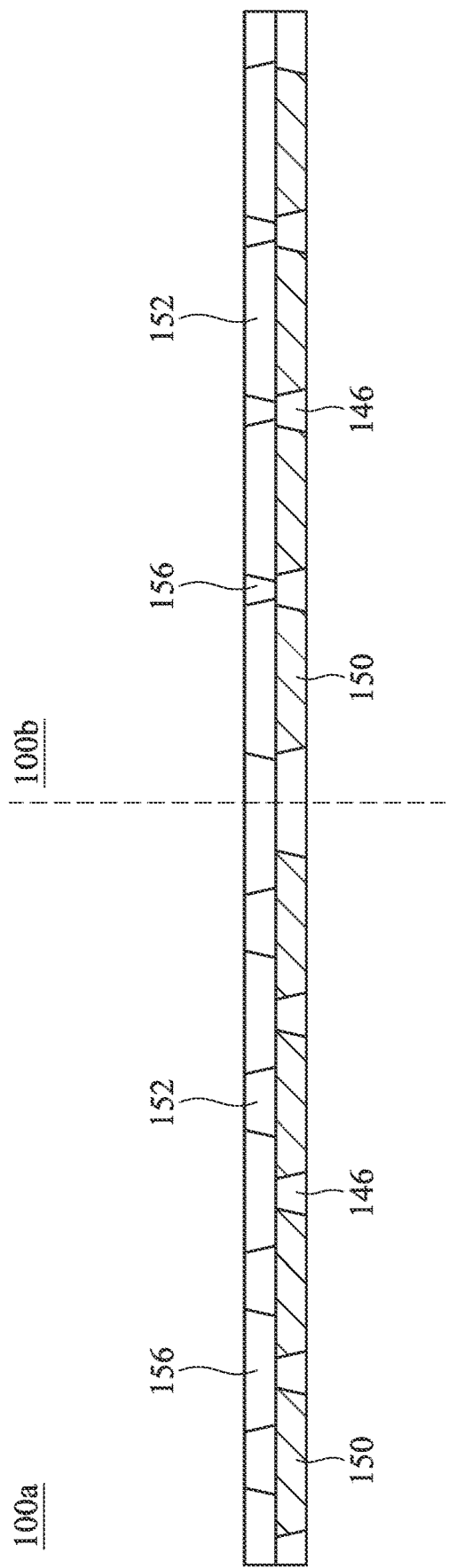

Afterwards, a dielectric layer material 156 is formed in the opening 154, as shown in FIGS. 2 and 4E in accordance with some embodiments. After the dielectric layer material 156 is deposited, a planarization process (e.g., a chemical mechanical polishing process or an etching back process) may optionally be performed to remove excess dielectric layer materials. In some embodiments, the top surface of the dielectric layer 156 is level with the top surface of the first MTJ stack 152. The processes and materials for forming the dielectric layer material 156 may be the same as, or similar to, those used to form the dielectric layer 146. For the purpose of brevity, the descriptions of these processes and materials are not repeated herein.

Figure 4F:
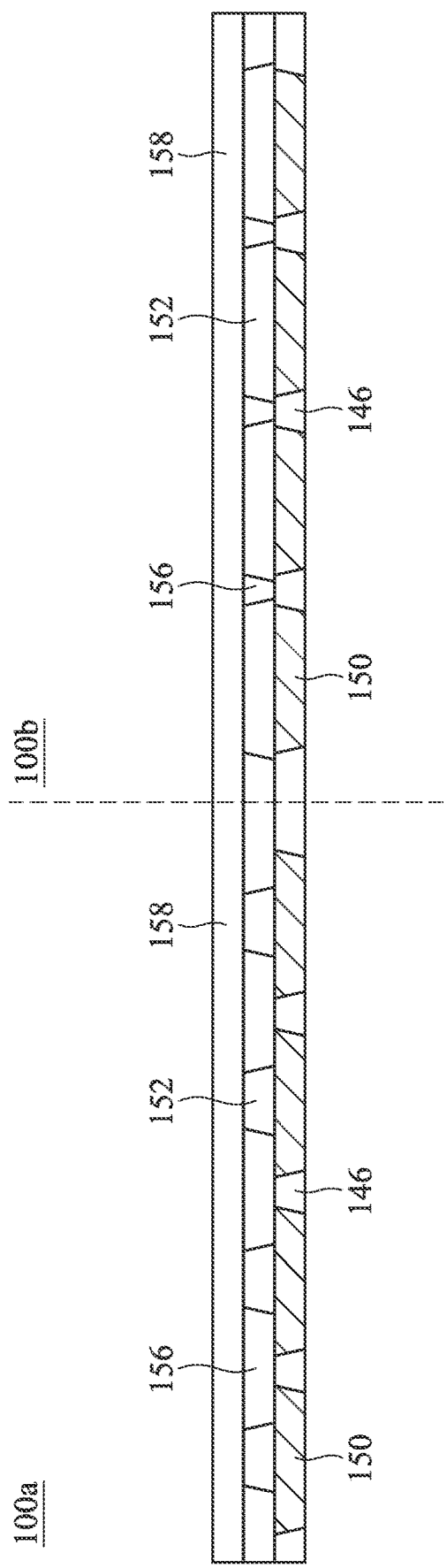

Next, a second MTJ stack material 158 is formed over the dielectric layer 156 and the first MTJ stack 152, as shown in FIGS. 2 and 4F in accordance with some embodiments. The processes for forming the second MTJ stack material 158 may be the same as, or similar to, those used to form the first MTJ stack material 152. For the purpose of brevity, the descriptions of these processes are not repeated herein. However, in some embodiments, the composition or the sequence of the ferromagnetic layers in the second MTJ stack material 158 is different from the composition or the sequence of the first MTJ stack material 152. Therefore, the second MTJ stack 158 and the first MTJ stack 152 may provide different functions.

Figure 4G:
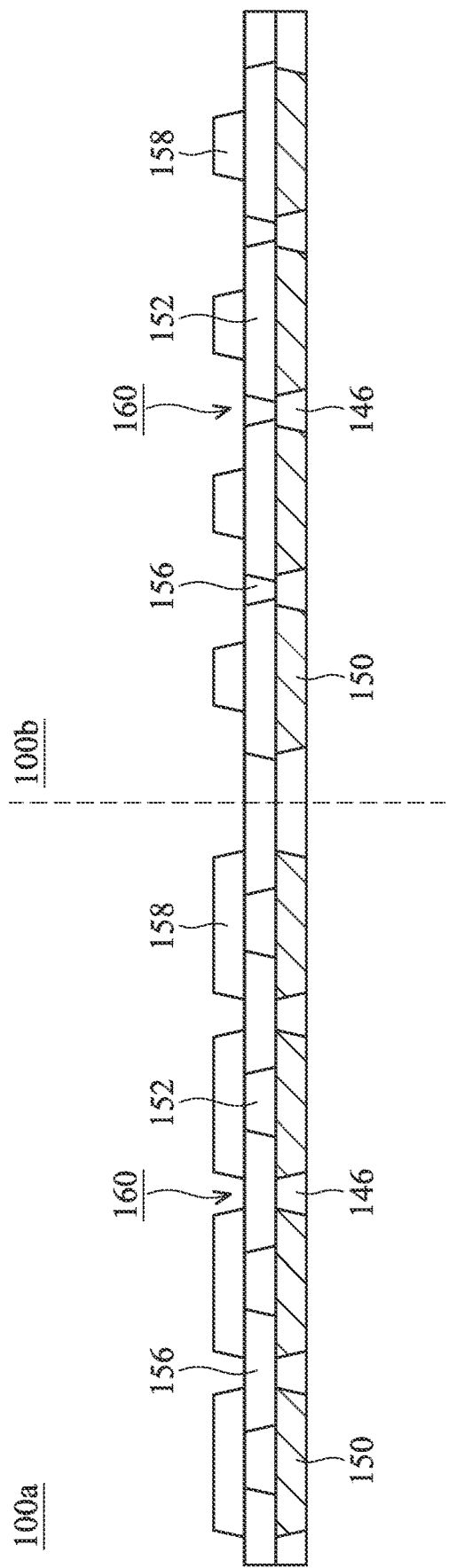

Next, the second MTJ stack material 158 is patterned and openings 160 is formed in the second MTJ stack material 158, and the second MTJ stack 158 is formed in the first region 100a and the second region 100b, as shown in FIGS. 2 and 4G in accordance with some embodiments.

Figure 4H:
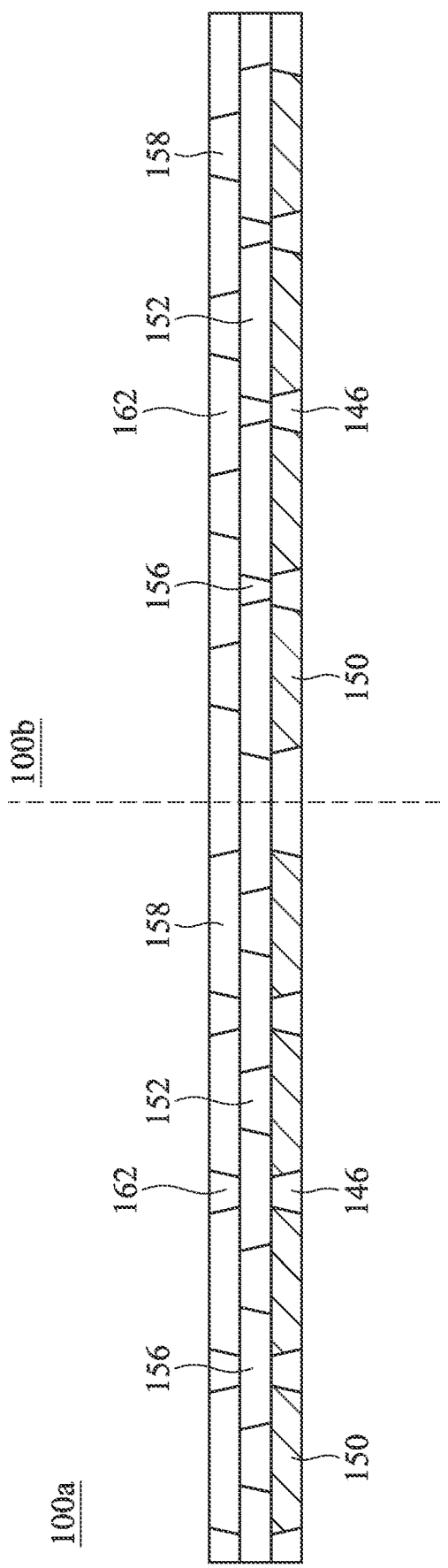
Figure 41:
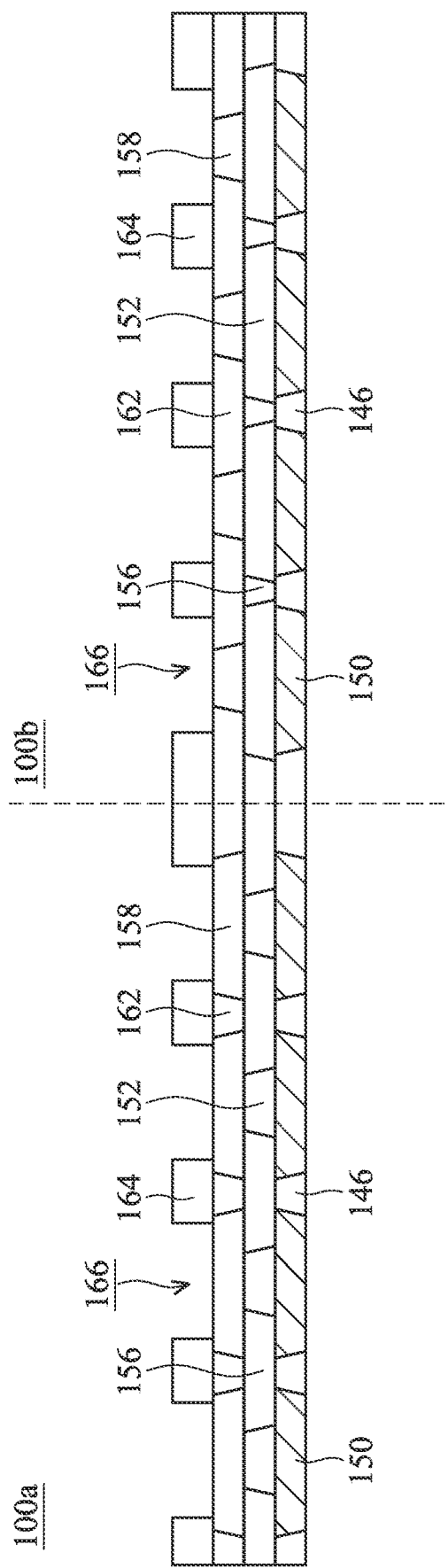

Afterwards, a dielectric layer material 162 is formed in the opening 160, as shown in FIGS. 2 and 4H in accordance with some embodiments. The processes and materials for forming the dielectric layer material 162 may be the same as, or similar to, those used to form the dielectric layer 156. For the purpose of brevity, the descriptions of these processes and materials are not repeated herein.

In some embodiments, the first MTJ stack 152 and the second MTJ stack 158 have an upward trapezoid shape in a cross-sectional view. In some embodiments, the first MTJ stack 152 is in direct contact with the second MTJ stack 158. In some embodiments, the second MTJ stack 158 in the first region 100a is wider than the second MTJ stack 158 in the second region 100b. In some embodiments, the area of the second MTJ stack 158 in the first region 100a is greater than the area of the second MTJ stack 158 in the second region 100b.

In some embodiments, the first MTJ stack 152 is narrower than the second MTJ stack 158 in the first region 100a, and the second MTJ stack 158 is narrower than the first MTJ stack 152 in the second region 100b. In some embodiments, the projection of the first MTJ stack 152 is within the projection of the second MTJ stack 158 in the first region 100a, and the projection of the second MTJ stack 158 is within the projection of the first MTJ stack 152 in the second region 100b.

Since the resistance is dominated by the area of the MTJ stack, the first MTJ stack 152 with smaller area may dominate the MRAM cell 122a in the first region 100a, and the second MTJ stack 158 with smaller area may dominate the MRAM cell 122b in the second region 100b. Therefore, the MRAM cell 122a in the first region 100a may provide function of the first MTJ stack 152, and the MRAM cell 122b in the second region 100b may provide function of the second MTJ stack 158. Therefore, the MRAM cells 100a and 100b may provide multi-function in different regions 100a and 100b within a single semiconductor memory structure 10a in a single chip.

Next, a dielectric layer 164 is formed over the second MTJ stack 158 and the dielectric layer 162, as shown in FIGS. 2 and 4I in accordance with some embodiments. The processes and materials for forming the dielectric layer material 164 may be the same as, or similar to, those used to form the dielectric layer 146. For the purpose of brevity, the descriptions of these processes and materials are not repeated herein.

Later, the dielectric layer 164 is patterned, and openings 166 are formed in the dielectric layer 164, as shown in FIGS. 2 and 4I in accordance with some embodiments. The second MTJ stack 158 may be exposed from the openings 166. The processes for forming the openings 166 the dielectric layer material 164 may be the same as, or similar to, those used to form the openings 148 in the dielectric layer 146. For the purpose of brevity, the descriptions of these processes and materials are not repeated herein.

Figure 4J:
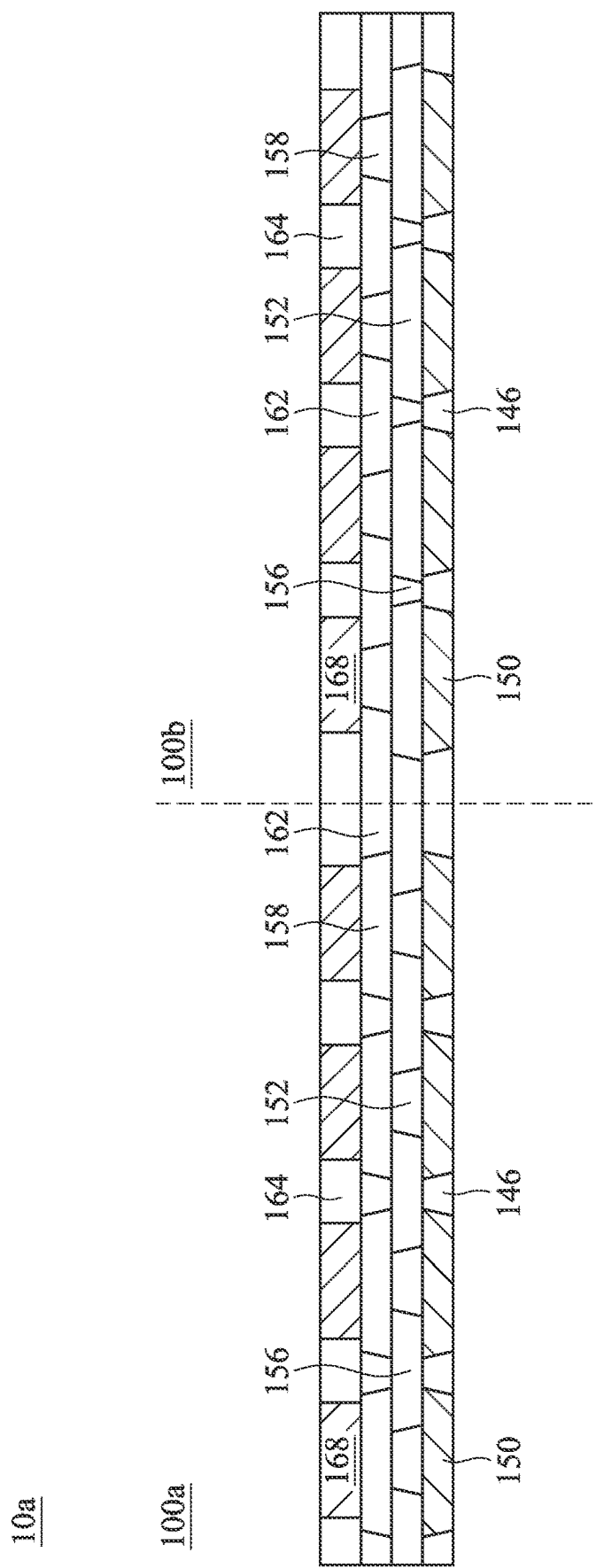

Next, a top electrode 168 is formed in the openings 166, as shown in FIGS. 2 and 4J in accordance with some embodiments. The processes and materials for forming the top electrode 168 may be the same as, or similar to, those used to form the bottom electrode 150. For the purpose of brevity, the descriptions of these processes and materials are not repeated herein.

A spacer layer may be formed over the sidewalls of the first MTJ stack 152, the second MTJ stack 158, the bottom electrode 150, and the top electrode 168 (not shown). The spacer layer may include dielectric materials such as silicon oxide ($SiO_x$), silicon nitride ($SiN_x$), silicon oxynitride ($Si_xO_yN_z$), or the like. A protective spacer layer may be formed over the sidewalls of the spacer layer (not shown). The protective spacer layer may include a magnetic material such as cobalt or NiFe. The magnetic protective spacer layer may shield horizontal external magnetic fields. The protective spacer layer may include non-magnetic material, such as alumina ($Al_2O_3$).

By piling MTJ stacks 152 and 158 with different sizes in different regions 100a and 100b of the semiconductor memory structure 10a, the resistance may be dominated by the MTJ stack with smaller size. By forming the ferromagnetic layers in the MTJ stacks 152 and 158 with different composition and in different sequences, the MRAM cells 122a and 122b may provide different functions. In this way, multi-functional MRAM cells 122a and 122b may be formed in different regions 100a and 100b in a single chip.

Figure 5:
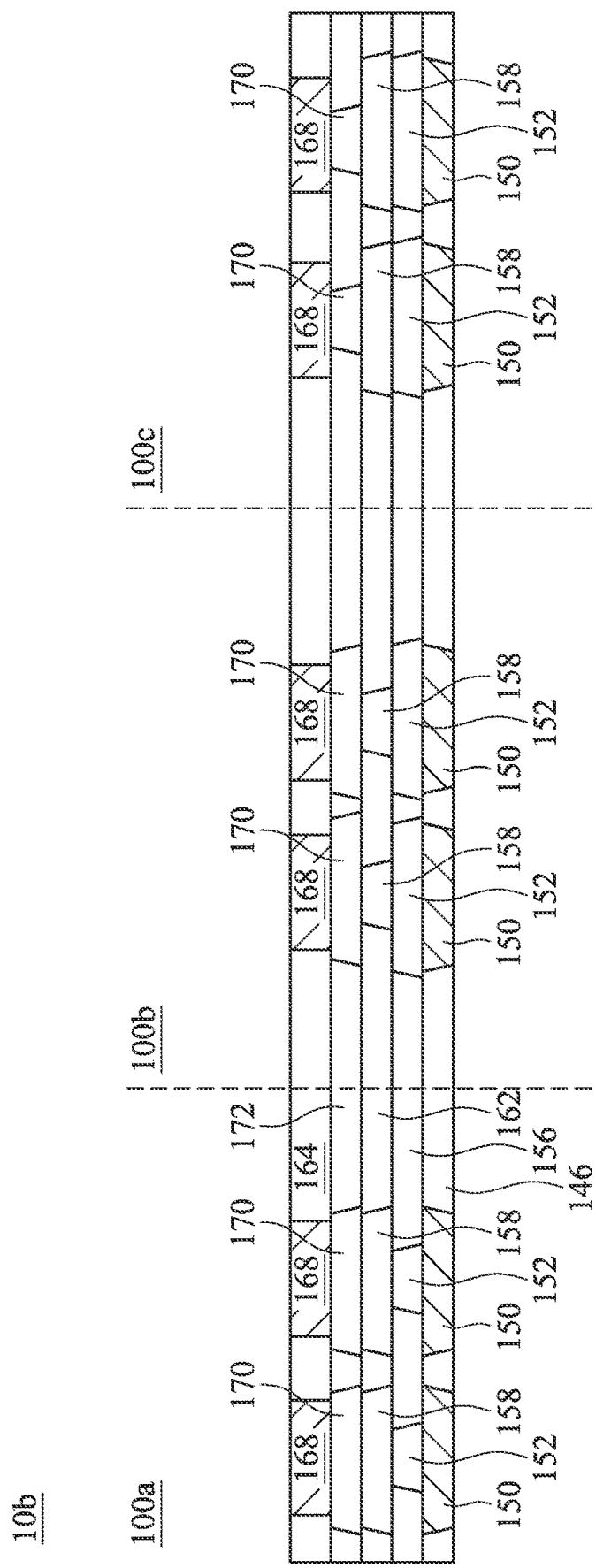
FIG. 5 is a cross-sectional representation of a modified semiconductor memory structure, in accordance with some embodiments of the disclosure.

Many variations and/or modifications may be made to the embodiments of the disclosure. FIG. 5 is a cross-sectional representation of a modified semiconductor memory structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, a third MTJ stack 170 is formed between the second MTJ stack 158 and the top electrode 168. In addition, the first MTJ stack 152, the second MTJ stack 158, and the third MTJ stack 170 are formed in the third region 100c of the semiconductor memory structure 10b.

After forming the first MTJ stack 152 and the second MTJ stack 158 in the third region 100c of the semiconductor memory structure 10b, a third MTJ stack material 170 is formed over the dielectric layer 162 and the second MTJ stack 158, as shown in FIG. 5 in accordance with some embodiments. The processes for forming the third MTJ stack material 170 may be the same as, or similar to, those used to form the second MTJ stack material 158. For the purpose of brevity, the descriptions of these processes are not repeated herein.

In some embodiments, the composition or the sequence of the ferromagnetic layers in the third MTJ stack material 170 is different from the composition or the sequence of the first MTJ stack material 152 and the second MTJ stack 158. Therefore, the first MTJ stack 152, the second MTJ stack 158, and the third MJT stack 170 may provide different functions.

Next, the third MTJ stack material 170 is patterned and openings are formed in the third MTJ stack material 170, and the third MTJ stack 170 is formed in the first region 100a, the second region 100b, and the third region 100c, as shown in FIG. 5 in accordance with some embodiments. In some embodiments, the third MTJ stack 170 in the third region 100c is narrower than the third MTJ stack 170 in the first region 100a and the second region 100b. In some embodiments, the area of the third MTJ stack 170 in the third region 100c is less than the area of the first MTJ stack 152 and the area of the second MTJ stack 158 in the third region 100c.

In some embodiments, the projection of the first MTJ stack 152 is within the projection of the third MTJ stack 170 in the first region 100a, and the projection of the second MTJ stack 158 is within the projection of the third MTJ stack 170 in the second region 100b. In some embodiments, the third MTJ stack 170 is narrower than the first MTJ stack 152 and the second MTJ stack 158 in the third region 100c.

Since the resistance is dominated by the area of the MTJ stack, the third MTJ stack 170 with smaller area may dominate the MRAM cell in the third region 100c. Therefore, the MRAM cell in the third region 100c may provide function of the third MTJ stack 170. Therefore, the MRAM cells 100a, 100b, and 100c may provide multi-function in different regions 100a, 100b, and 100c within a single semiconductor memory structure 10b in a single chip.

Afterwards, a dielectric layer material 172 is formed in the opening in the third MTJ stack material 170, as shown in FIG. 5 in accordance with some embodiments. After the dielectric layer material 172 is deposited, a planarization process (e.g., a chemical mechanical polishing process or an etching back process) may optionally be performed to remove excess dielectric layer materials 172. The processes and materials for forming the dielectric layer material 172 may be the same as, or similar to, those used to form the dielectric layer 162. For the purpose of brevity, the descriptions of these processes and materials are not repeated herein. In some embodiments, the third MTJ stack 170 is between the second MTJ stack 158 and the top electrode 168. In some embodiments, the third MTJ stack 170 is in contact with the second MTJ stack 158 and the top electrode 168.

It should be noted that, although in the embodiments of FIG. 5, three MTJ stacks are formed in three regions of the semiconductor memory structure, the number of the MTJ stacks and the regions of the semiconductor memory structure are not limited thereof, depending on the design.

By forming MTJ stacks 152, 158, and 170 with different sizes in different regions 100a, 100b, and 100c of the semiconductor memory structure 10b, the resistance may be dominated by the MTJ stack with smallest size. By forming the ferromagnetic layers in the MTJ stacks 152, 158, and 170 with different composition and in different sequences, the MRAM cells may provide different functions in different regions 100a, 100b, and 100c. In this way, multi-functional MRAM cells may be formed in different regions in a single chip. The number of the MTJ stacks and the regions of the semiconductor memory structure 10b are not limited thereto, depending on the design.

As described previously, MRAM cells 122a and 122b may be formed in different regions 100a and 100b. MRAM cells 122a and 122b may include piling different MTJ stacks 152 and 158 with different sizes. The MTJ layers in different MTJ stacks may include different composition and arranged in different sequence. Therefore, different MTJ stacks may provide different functions. The MTJ stack 152 and 158 with smaller size may dominate the resistance. Therefore, different functions may be provided by MRAM cells 122a and 122b in different regions 100a and 100b. Multi-function semiconductor memory structure 10a may be formed in a single chip. In some embodiments as shown in FIG. 5, the number of MTJ stacks and the regions may depend on the design.

Embodiments of a semiconductor memory structure and a method for forming the same are provided. The MTJ stacks with different sizes and different composition may be piled in different MRAM cells. MTJ stacks with different composition and arranged in different sequence may provide different functions. The MTJ stack with the smallest size may dominate the resistance of the MRAM cell and multi-functions of the MRAM cells may be provided in a single chip.

In some embodiments, a semiconductor memory structure is provided. The semiconductor memory structure includes bottom electrodes formed over a substrate. The semiconductor memory structure also includes first magnetic tunneling junction (MTJ) elements formed over the bottom electrodes in a first region and a second region of the substrate. The semiconductor memory structure also includes second MTJ elements formed over the first MTJ elements in the first region and the second region. The semiconductor memory structure also includes top electrodes formed over the second MTJ elements. The first MTJ elements in the first region are narrower than the second MTJ elements in the first region, and the second MTJ elements in the second region are narrower than the first MTJ elements in the second region.

In some embodiments, a semiconductor memory structure is provided. The semiconductor memory structure includes devices formed in a first region and a second region of a substrate. The semiconductor memory structure also includes bottom electrodes formed over the devices. The semiconductor memory structure also includes first MTJ stacks formed over the bottom electrodes. The semiconductor memory structure also includes second MTJ stacks formed over the first MTJ stacks. The semiconductor memory structure also includes top electrodes formed over the second MTJ stacks. A projection of one of the first MTJ stacks in the first region is within a projection of one of the second MTJ stacks in the first region, and the projection of one of the second MTJ stacks in the second region is within the projection of one of the first MTJ stack in the second region.

In some embodiments, a method for forming a semiconductor memory structure is provided. The method for forming a semiconductor memory structure includes forming bottom electrodes in a substrate. The method for forming a semiconductor memory structure also includes depositing a first MTJ material over the bottom electrode. The method for forming a semiconductor memory structure also includes patterning and etching the first MTJ material to form first MTJ elements over the bottom electrodes in a first region and a second region in the substrate. The method for forming a semiconductor memory structure also includes depositing a second MTJ material over the first MTJ elements. The method for forming a semiconductor memory structure also includes patterning and etching the second MTJ material to form second MTJ elements over the first MTJ elements in the first region and the second region in the substrate. The method for forming a semiconductor memory structure also includes forming top electrodes over the second MTJ element. The first MTJ elements in the first region are narrower than the first MTJ elements in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor memory structure, comprising:
   forming bottom electrodes in a substrate;
   depositing a first MTJ material over the bottom electrodes;
   patterning and etching the first MTJ material to form first MTJ elements over the bottom electrodes in a first region and a second region in the substrate;
   depositing a second MTJ material over the first MTJ elements;
   patterning and etching the second MTJ material to form second MTJ elements over the first MTJ elements in the first region and the second region in the substrate; and
   forming top electrodes over the second MTJ elements,
   wherein the first MTJ elements in the first region are narrower than the first MTJ elements in the second region, wherein bottom widths of the second MTJ elements are greater than top widths of the second MTJ elements.

2. The method for forming a semiconductor memory structure as claimed in claim 1, further comprising:
   depositing a third MTJ material over the second MTJ elements; and
   patterning and etching the third MTJ material to form third MTJ elements over the second MTJ elements in the first region, the second region, and a third region in the substrate,
   wherein the third MTJ elements are between the second MTJ elements and the top electrodes.

3. The method for forming a semiconductor memory structure as claimed in claim 2, wherein an area of the third MTJ elements in the third region is less than an area of the first MTJ elements in the third region and an area of the second MTJ elements in the third region.

4. The method for forming a semiconductor memory structure as claimed in claim 1, further comprising:
   forming a gate structure over the substrate;
   forming a drain structure and a source structure over opposite sides of the gate structure; and
   forming a contact structure over the drain structure,
   wherein the bottom electrodes are electrically connected to the contact structure.

5. The method for forming a semiconductor memory structure as claimed in claim 1, further comprising:
   filling a dielectric layer between the first MTJ elements, wherein bottom surfaces of the second MTJ elements is substantially level with a top surface of the dielectric layer.

6. The method for forming a semiconductor memory structure as claimed in claim 1, wherein widths of the bottom electrodes are greater than bottom widths of the first MTJ elements in the first region.

7. The method for forming a semiconductor memory structure as claimed in claim 1, wherein top widths of the bottom electrodes are greater than bottom widths of the bottom electrodes.

8. A method for forming a semiconductor memory structure, comprising:
   forming devices in a first region and a second region of a substrate;
   forming bottom electrodes over the devices;
   forming first MTJ stacks over the bottom electrodes;
   filling a dielectric layer between the first MTJ stacks;
   forming second MTJ stacks over the first MTJ stacks and the dielectric layer, wherein there is an interface between the dielectric layer and the second MTJ stacks in the first region; and
   forming top electrodes over the second MTJ stacks,
   wherein a projection of one of the first MTJ stacks in the first region is within a projection of one of the second MTJ stacks in the first region, and a projection of one of the second MTJ stacks in the second region is within a projection of one of the first MTJ stacks in the second region.

9. The method for forming a semiconductor memory structure as claimed in claim 8, further comprising:
   forming third MTJ stacks formed over the second MTJ stacks,
   wherein the devices are formed in a third region of the substrate, and the projection of one of the third MTJ stacks in the third region is within the projection of one of the first MTJ stacks in the third region and is within the projection of one of the second MTJ stacks in the third region.

10. The method for forming a semiconductor memory structure as claimed in claim 9, wherein the third MTJ stacks in the third region are narrower than the third MTJ stacks in the first region and the second region.

11. The method for forming a semiconductor memory structure as claimed in claim 9, wherein the projection of one of the first MTJ stacks in the first region is within a projection of one of the third MTJ stacks in the first region, and the projection of one of the second MTJ stacks in the second region is within a projection of one of the third MTJ stacks in the second region.

12. The method for forming a semiconductor memory structure as claimed in claim 9, wherein each of the first MTJ stacks, the second MTJ stacks, and the third MTJ stacks has an upward trapezoid shape in a cross-sectional view.

13. The method for forming a semiconductor memory structure as claimed in claim 9, wherein the first MTJ stacks, the second MTJ stacks, and the third MTJ stacks have different compositions.

14. The method for forming a semiconductor memory structure as claimed in claim 9, wherein MTJ layers of the first MTJ stacks, MTJ layers of the second MTJ stacks, and MTJ layers of the third MTJ stacks are arranged in different sequences.

15. A method for forming a semiconductor memory structure, comprising:
   forming bottom electrodes in a first region and a second region in a substrate;
   forming a first MTJ material over the bottom electrodes;
   patterning and etching the first MTJ material to form first MTJ stacks with different areas in the first region and the second region by a first mask;
   forming a second MTJ material in direct contact with the first MTJ stacks;
   patterning and etching the second MTJ material to form second MTJ stacks with different areas in the first region and the second region by a second mask; and
   forming top electrodes over the second MTJ stacks, wherein the first MTJ stacks are narrower than the second MTJ stacks in the first region and are narrower than the first MTJ stacks in the second region.

16. The method for forming a semiconductor memory structure as claimed in claim 15, wherein the second MTJ stacks are narrower than the first MTJ stacks in the second region.

17. The method for forming a semiconductor memory structure as claimed in claim 15, wherein a width of the first MTJ stacks decreases in a first direction, and a width of the bottom electrodes decreases in a second direction opposite the first direction.

18. The method for forming a semiconductor memory structure as claimed in claim 17, wherein the first direction is away from the substrate and the second direction is toward the substrate.

19. The method for forming a semiconductor memory structure as claimed in claim 15, further comprising:
   after forming the second MTJ stacks, forming a dielectric layer surrounding the second stacks,
   wherein the dielectric layer extends over a top surface of the first MTJ stacks in the second region.

20. The method for forming a semiconductor memory structure as claimed in claim 15, further comprising:
   forming a third MTJ material in direct contact with the second MTJ stacks; and
   patterning and etching the third MTJ material to form third MTJ stacks with different areas in the first region, the second region, and a third region in the substrate by a third mask,
   wherein the third MTJ stacks are narrower than the first MTJ stacks in the third region.

* * * * *